United States Patent [19]
Fischer et al.

[11] Patent Number: 6,012,159
[45] Date of Patent: Jan. 4, 2000

[54] METHOD AND SYSTEM FOR ERROR-FREE DATA TRANSFER

[75] Inventors: Michael Fischer, Hamden, Conn.; Sophia Paleologou, Astoria, N.Y.

[73] Assignee: KenCast, Inc., Stamford, Conn.

[21] Appl. No.: 08/785,443

[22] Filed: Jan. 17, 1997

Related U.S. Application Data

[60] Provisional application No. 60/010,111, Jan. 17, 1996.

[51] Int. Cl.[7] .................................................. H03M 13/00
[52] U.S. Cl. ...................... 714/755; 714/761; 714/774; 714/776
[58] Field of Search ............................ 371/37.01, 37.02, 371/39.1; 714/755, 774, 776, 752, 761

[56] References Cited

U.S. PATENT DOCUMENTS

| | | | |
|---|---|---|---|
| 4,718,066 | 1/1988 | Rogard ...................................... | 371/35 |
| 5,485,474 | 1/1996 | Rabin ........................................ | 371/37 |
| 5,600,663 | 2/1997 | Ayanoglu et al. ........................ | 371/41 |
| 5,631,907 | 5/1997 | Guarneri et al. ......................... | 370/474 |

OTHER PUBLICATIONS

Michael O.Rabin, "Probabilistic Algorithms in Finite Fields", Siam J. Comput. vol. 9, No. 2, May 1980, pp. 273–280.

Michael O. Rabin, Efficient Dispersal of Information for Security, Load Balancing, and Fault Tolerance, Journal of the Association for Computing Machinery, vol. 36, No. 2, Apr. 1989, pp. 335–348.

R.J. McEliece and D.V. Sarwate, "On Sharing Secrets and Reed–Solomon Codes", Communications of the ACM, Sep. 1981 vol. 24, No. 9, pp. 583–584.

Adi Shamir, "How to Share a Secret", communications of the ACM, Nov., 1979; vol. 22, No. 11, pp. 612–613.

C.A. Asmuth and G.R. Blakley, Proceedings of the 1982 Symposium on Security and Privacy, IEEE Computer Society, Apr. 26–28, 1982 Oakland California, pp. 156–169.

Ehud D. Karnin, et al. "On Secret Sharing Systems", IEEE Transactions on Information Theory, vol. It–29, No. 1, Jan. 1983.

McAuley, "Reliable Broadband Communication Using A Burst Erasure Correcting Code", SIGCOMM '90 Symposium, pp. 297–306, Sep. 1990.

*Primary Examiner*—Stephen M. Baker
*Attorney, Agent, or Firm*—Fitzpatrick, Cella, Harper & Scinto

[57] ABSTRACT

A method and system are provided for transferring data from a host computer to one or more subscriber computers, the data consisting of k original packets. The method includes the steps of encoding the k original packets to form n encoded packets, where n>k, transmitting the encoded packets from the host computer to the subscriber computers, receiving some of the transmitted packets, and decoding any combination of k correctly-received encoded packets to reconstruct the k original packets.

23 Claims, 27 Drawing Sheets

$$\begin{array}{ccccc} 1 & 1 & 1 & \cdots & 1 \\ a_1 & a_2 & a_3 & \cdots & a_n \\ a_1^2 & a_2^2 & a_3^2 & \cdots & a_n^2 \\ \cdots & \cdots & \cdots & \cdots & \cdots \\ a_1^{(k-1)} & a_2^{(k-1)} & a_3^{(k-1)} & \cdots & a_n^{(k-1)} \end{array}$$

$$V = \begin{matrix} 1 & 1 & 1 & 1 & 1 & 1 & 1 & 1 & 1 & 1 \\ 0 & 1 & 2 & 3 & 4 & 5 & 6 & 7 & 8 & 9 \\ 0 & 1 & 4 & 5 & 16 & 17 & 20 & 21 & 64 & 65 \\ 0 & 1 & 8 & 15 & 64 & 85 & 120 & 107 & 58 & 115 \\ 0 & 1 & 16 & 17 & 29 & 28 & 13 & 12 & 205 & 204 \\ 0 & 1 & 32 & 51 & 116 & 108 & 46 & 36 & 38 & 226 \\ 0 & 1 & 64 & 85 & 205 & 193 & 228 & 252 & 45 & 161 \end{matrix}$$

FIG. 6A

$$G = \begin{matrix} 1 & 0 & 0 & 0 & 0 & 0 & 0 & 1 & 61 & 66 \\ 0 & 1 & 0 & 0 & 0 & 0 & 0 & 1 & 163 & 220 \\ 0 & 0 & 1 & 0 & 0 & 0 & 0 & 1 & 157 & 245 \\ 0 & 0 & 0 & 1 & 0 & 0 & 0 & 1 & 20 & 124 \\ 0 & 0 & 0 & 0 & 1 & 0 & 0 & 1 & 192 & 214 \\ 0 & 0 & 0 & 0 & 0 & 1 & 0 & 1 & 55 & 33 \\ 0 & 0 & 0 & 0 & 0 & 0 & 1 & 1 & 225 & 225 \end{matrix}$$

FIG. 6B

$$A = \begin{matrix} 1 & 0 & 0 & 0 & 0 & 61 & 66 \\ 0 & 0 & 0 & 0 & 0 & 163 & 220 \\ 0 & 1 & 0 & 0 & 0 & 157 & 245 \\ 0 & 0 & 0 & 0 & 0 & 20 & 124 \\ 0 & 0 & 1 & 0 & 0 & 192 & 214 \\ 0 & 0 & 0 & 1 & 0 & 55 & 33 \\ 0 & 0 & 0 & 0 & 1 & 225 & 225 \end{matrix}$$

FIG. 6C

$$A^{-1} = \begin{matrix} 1 & 200 & 0 & 8 & 0 & 0 & 0 \\ 0 & 239 & 1 & 101 & 0 & 0 & 0 \\ 0 & 37 & 0 & 244 & 1 & 0 & 0 \\ 0 & 226 & 0 & 183 & 0 & 1 & 0 \\ 0 & 244 & 0 & 89 & 0 & 0 & 1 \\ 0 & 164 & 0 & 69 & 0 & 0 & 0 \\ 0 & 177 & 0 & 51 & 0 & 0 & 0 \end{matrix}$$

```
M'............................................................
M'............................................................
M'............................................................
M'............................................................
M'............................................................
M'............................................................
M'............................................................
M'............................................../#Q.35-'/CX''%(V,#'P
M#OHM('-T86-K(&)V97)P;&)W#OH''P!2-C'P,PT'·+2!I;G1E9V5R(&1I#FED
M92!B>2'P#OH''0!2-C'P.0T'·+2!N;W0#96YO#6=H('-P86-E(&90<B!E;G9I
M<F)N;65N#'T#'!('4C8P,30-'BT#6YE>'!!E8W1E9

FIG. 10N end

Send Object Now

File Retries [1] (1-255)

Packet Retries [1] (1-255)

Error Correction Info
Expected Packet Loss [20]
(1-50%, 0=Disabled)

Original File Size 1274928

Error Correcting File Size 1615680

☐ Use Previous File Encoding

Cycling
☐ Cycling
No Of Cycles [0] (1-255)
Hrs [ ] Mins

☐ Periodic
Cycling Type [Daily ◇]

☒ Save Missed Packets
☒ Broadcast to all

[OK]  [Cancel]

FIG. 12

METHOD AND SYSTEM FOR ERROR-FREE DATA TRANSFER

CROSS-REFERENCE TO RELATED APPLICATIONS

This application claims the benefit of U.S. Provisional Application No. 60/010,111, filed Jan. 17, 1996.

BACKGROUND OF THE INVENTION

1. Field of the Invention

The present invention relates to a method and system for reliable transfer of data. In particular, the present invention provides a method and system of error correction coding to ensure that large, multimedia data files, including digitized music, still images or moving images, such as may be transmitted using one-way satellite broadcasting, are received error-free despite the effects of various types of noise interfering with the transmitted signal.

2. Description of Related Art

Today, the availability of powerful digital computational tools has yielded the ability to present information and data in forms that go far beyond text and numbers. There now exists the capability to create and share data in more complex multimedia forms, using graphics, audio, still images, moving images (video), and combinations thereof. However, digital multimedia data generally is far larger in size than text data. For example, whereas a conventional text file usually occupies less than 50 Kilobytes (Kbyte), just one minute of compressed video requires up to 10 Megabytes (Mbyte), almost 200 times larger in size.

The presentation of information in multimedia form therefore creates two problems—storage and communication. Storage has improved dramatically over the past few years. For example, personal computers (PCs) can now store inexpensively many Gigabytes (Gbyte) of data, and the cost-per-Gbyte is becoming less expensive every day.

Communications, however, remain a problem. Historically, the oldest method of distributing large amounts of information has been printed material, usually in the form of magazines and books. However, this method is relatively expensive, takes days to complete, is limited to presenting data in text, pictorial or graphic form, and is difficult to update or change. Distribution of information via audio cassette or video cassette, while less costly and allowing information to be presented in audio and video form, is still relatively slow in that shipment of the physical item containing the information must take place, and the cassette itself still makes it relatively difficult to update and change the information.

More practical than printed material and cassettes, graphics, music and other information may be digitized into computer data files, referred to as "large digital objects," which in turn may be transferred from a host computer to a potentially large number of subscriber computers. One common way of transferring data files is via a public or private computer network, in which the data files are transmitted by the host computer and received by the subscriber computers over phone lines via a modem. Although distribution via modems may work well for multi-Kbyte files, transmitting multi-Mbyte data files is impractical even when using the fastest modems, because the transmission speed of modems is constrained by the relatively low bandwidth of the telephone lines. For example, reliably retrieving just one large data object using the Internet, or other public or private networks, even when using ISDN lines, may take many minutes to many hours, and is relatively expensive.

To avoid overloading expensive private networks, many companies distribute large text files and other large digital objects using CD-ROM disks, each of which can hold, for example, up to 660 Mbytes of data. While the cost of distribution is moderate in comparison to using a network, the distribution of CD-ROM disks suffers from one major drawback shared by the oldest methods of information distribution—it can take one or more days, in comparison to the theoretically near-instantaneous communication potential that digital information should enjoy. Further, to update this CD-ROM based information, new CD-ROMS must be provided, usually from every three months to a year.

To overcome the problems associated with the above methods of distribution, distributors of large digital objects are turning to satellite broadcasting. Satellite broadcasting provides not only distribution over large geographical areas, for example, the entire United States and Canada, but potentially has the high bandwidth capacity required to transmit large digital objects at high speeds, thus reducing the transmission time to seconds. Moreover, the cost of satellite broadcasting, on a per-user basis, is comparatively less than the respective costs of the above methods. A one-way broadcast satellite system, shown in FIG. 1, transfers data from the host computer 1 to a satellite transmitter device 2. The satellite transmitter device 2 in turn transmits, through an uplink antenna 4, the data to a satellite 5 using modulation techniques well-known in the art. The satellite 5 retransmits the data to one or more downlink antennas 6 and satellite receiver devices 7. The satellite receiver device 7 transfers the data to the subscriber computer 8.

In such a system, it is essential in most applications that the transferred data files are reliably received in perfect condition at all the subscriber computers. For example, the transferred data file from the host may contain sensitive financial information in which no errors are acceptable. One notable drawback of one-way satellite broadcast systems, however, as compared to other standard methods of information distribution such as the above-described computer networks, is the inability of the subscriber computers to inform the host that a reception error has occurred.

Another drawback of satellite broadcasting is a greater vulnerability of the transmitted signal to various forms of noise interference present in the transmission channel.

One form of noise that is always present in the channel is "white" noise. For example, white noise is introduced in the satellite channel by the thermal radiation of the gaseous constituents of the earth's surface. The strength and frequency of this noise varies, and it sometimes overpowers the transmitted signal causing it to be received erroneously. Because of white noise, a transmitted binary "zero" bit is occasionally received erroneously as a binary "one" bit, and vice-versa. Such errors are known as bit errors. White noise generally tends to cause isolated bit errors in a transmitted message. Although these bit errors are usually spread out throughout the message, they can be easily detected and corrected, because they are isolated.

In contrast with white noise, "impulse" noise tends to wipe out long sequences of consecutive bits. Such errors are known as "burst" errors. Their duration varies from a few milliseconds to a few seconds, but certain phenomena, such as rainstorms or sunspots, can cause burst errors of even longer duration such as a few minutes. Unlike bit errors due to white noise, burst errors are not distributed over the entire message, but only a portion thereof. However, burst errors are more difficult to detect and correct, because they wipe out so many consecutive bits of data.

Well-known error detection and correction (EDAC) schemes are used to reduce the effects of errors caused by white noise. EDAC generally operates at the bit level by adding enough redundant data bits to the data to detect and correct the received data. In practice, EDAC can only detect and correct a limited amount of bit errors. The redundant data added to the original data, however, obviously increases the amount of data to be transmitted and thus the transmission bandwidth and transmission time. Well-known EDAC schemes include Hamming, Viterbi, Reed-Solomon, and other forward error correction (FEC) coding schemes.

Interleaving may also be performed at the bit level. Interleaving rearranges the data bits so that they are non-sequentially transmitted. The subscriber computer deinterleaves the received bits to reorder the bits as they originally appeared. This technique reduces the effect of errors in a sequence of bits. Although interleaving does not in itself correct those bit errors, by non-sequentially reordering the data bits in a block of data that is to be transmitted by the host computer, the bit errors are more uniformly distributed over the received block of data upon deinterleaving by the subscriber computer. By isolating the bit errors, interleaving enhances bit-level EDAC coding performance. Both EDAC and interleaving can also be performed on data symbols representing groups of bits, such as bytes.

In satellite broadcast systems, the transmitted data bits or symbols are most likely to be organized into large groups called packets, and a large digital object is transmitted as a sequence of packets. The addressed subscriber computers reconstruct the large digital object from the received packets. The above-described noise bursts, especially those due to rainstorms and sunspots, can typically damage one or more long sequences of consecutive packets, the effect of which is shown in FIG. 2. Those packets are either not received by one or more of the subscriber computers or are received severely corrupted. Although bit-level EDAC schemes might be able to correct some of the corrupted packets, depending on the number of erroneous bits in those corrupted packets, these schemes are simply not robust enough to correct the great majority of those corrupted packets. This is because, in extended periods of burst noise, a large amount of both the original data bits and redundant EDAC bits in a packet are received corrupted, thus making bit-level error correction, and thus packet-level error-correction, impossible. Moreover, EDAC schemes are useless in the case of those packets not received.

One known method for reducing the effect of burst errors in satellite broadcast systems is retransmission of those packets that were not received or were received corrupted and could not be corrected (hereinafter those packets are simply referred to as "lost"). For example, a host computer may broadcast via satellite to two geographically widely-separated subscriber computers A and B. Due to this wide separation, subscriber computer A and subscriber computer B may experience different weather conditions, and thus different patterns of noise. For example, subscriber computer A may lose 20% of the transmitted packets, while subscriber computer B may successfully receive all the transmitted packets.

Although it is possible to rebroadcast the entire file to all the subscriber computers, this method is costly, wastes time and bandwidth, and prevents the satellite channel from being used for other purposes. In the above example, subscriber computer A would identify the lost packets (by examining the serial numbers of the correctly received packets) and would ask the host computer to retransmit the packets it missed until the entire large digital object could be reconstructed perfectly by subscriber computer A. The request for missed packet retransmission is made through a back channel, and the host computer rebroadcasts those missed packets via satellite. Alternatively, the host computer retransmits those missed packets only to subscriber computer A through the back channel.

Retransmission of lost packets requires, however, (1) two-way communication back channels from all of the subscriber computers to the host computer so each subscriber computer can inform the host computer of which packets were lost, and (2) a retransmission protocol between the host computer and the subscriber computers. Each back channel usually takes the form of a modem and telephone lines, or is part of a standard computer network. The back channel therefore has a limited bandwidth and can timely transmit only a limited amount of information. Back channels are also expensive. Further, retransmission increases the time required to distribute the large digital object, and prevents the host computer and subscriber computers from doing other tasks.

Thus, none of the current error correction schemes or data retransmission techniques provides a reliable and efficient method of transferring large digital objects over a one-way broadcast satellite system.

SUMMARY OF THE INVENTION

The present invention provides a reliable and efficient method and system for transferring long sequences of data packets, such as those comprising a large digital object over a one-way broadcast satellite system to overcome the effects of burst errors which conventional EDAC methods fail to correct altogether and retransmission fails to correct efficiently. It accomplishes this by transforming the original packet sequence into an encoded packet sequence, so that if any combination of encoded packets, equal in number to the number of original packets, is successfully received, the original packet sequence can be recovered. By accurately estimating the number of packets expected to be lost because of noise, only the minimum number of encoded packets need be generated and broadcast, thus providing an efficient, bandwidth-minimizing transfer method and system for packet sequences such as files. Moreover, since each subscriber computer can independently reconstruct the original packets error-free, the present invention eliminates the need for retransmission, saving both money and time and making more efficient use of the satellite channel and the back channels, if present.

In accordance with one aspect of the invention, a method and a system are provided for transferring data from a host computer to one or more subscriber computers, the data consisting of a plurality of k original packets, where k is a positive integer. The method includes the steps of encoding the k original packets to form n encoded packets, where n>k, transmitting the encoded packets from the host computer to the subscriber computers, receiving some of the transmitted packets, and decoding any combination of k correctly-received encoded packets to reconstruct the original k packets.

BRIEF DESCRIPTION OF THE DRAWINGS

The various aspects of the present invention can be best understood by reference to the detailed description of the preferred embodiments set forth below taken with the drawings, in which:

FIG. 4 depicts a Vandermonde matrix used in the first embodiment of the present invention.

FIG. 5 depicts a code generator matrix used in the second embodiment of the present invention.

FIGS. 6A–6D respectively depict a Vandermonde matrix V, a code generator matrix G, a matrix A and an inverted matrix $A^{-1}$, used in an example of the second embodiment of the present invention.

FIGS. 10A–10N depict UU-encoded object code representative of the encoding and decoding methods of the present invention.

FIG. 12 depicts transmitting side information for the still image shown in FIG. 11, to be transmitted by the fifth embodiment of the present invention.

DETAILED DESCRIPTION OF THE PREFERRED EMBODIMENTS

In the first embodiment of the present invention, a file error-correcting coding method encodes a data file of original packets yielding a new file of encoded packets. The host computer then transmits the encoded file through a satellite transmitter device and antenna to a satellite using packet-based broadcast techniques. One or more downlink antennas and satellite receiver devices receive the transmitted packets and transfer the same to the respective subscriber computers. The file can be reconstructed without any errors by using the file error-correcting decoding method of the present invention, despite packet loss caused by the noisy transmission channel, as long as the number of encoded packets correctly received is greater than or equal to the number of original packets. If this is the case, the subscriber computer can reconstruct the file from any combination of the correctly-received encoded packets.

Figure 3A:
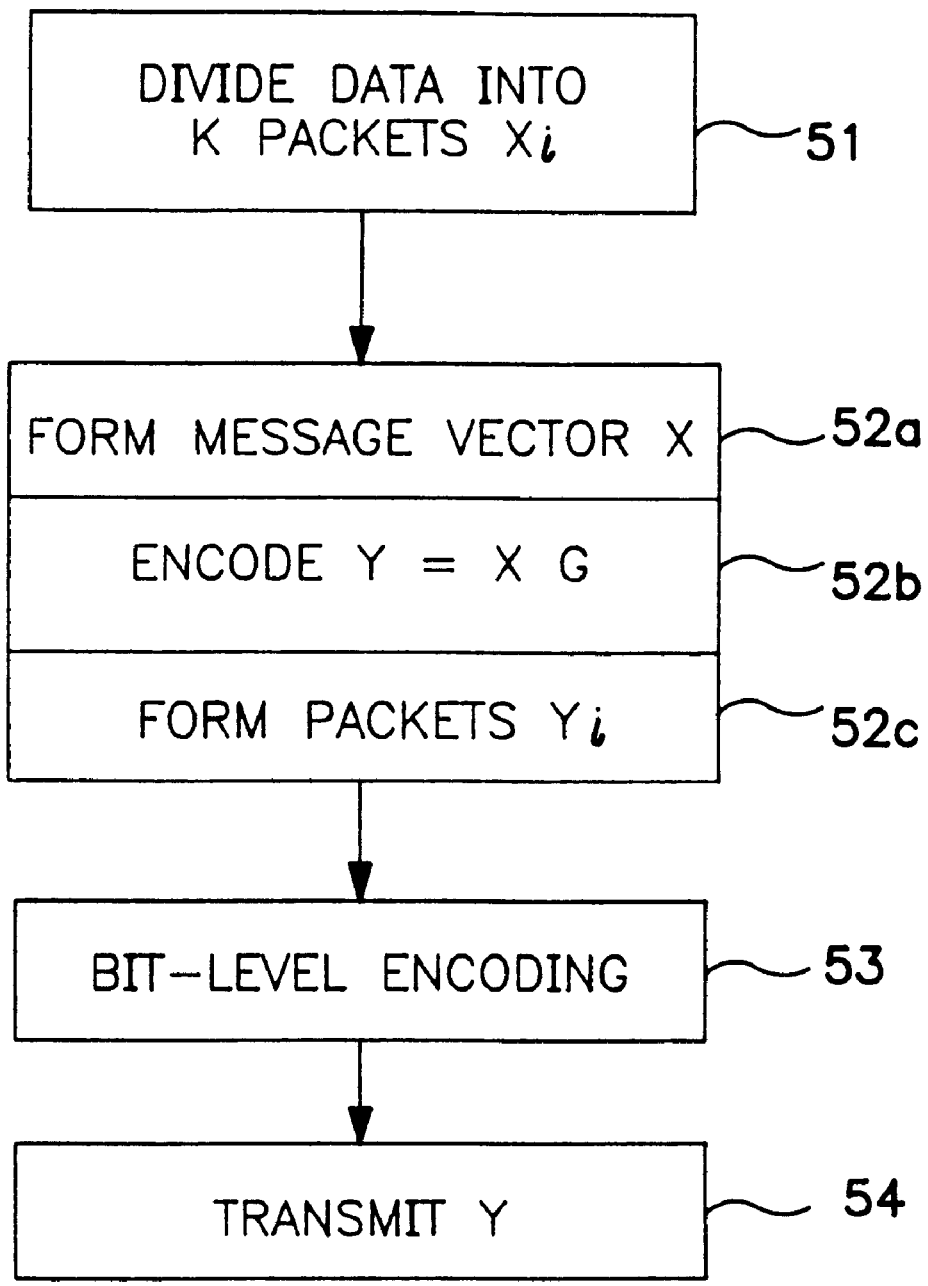
FIGS. 3A and 3B respectively depict flowcharts for the transmitting side and the receiving side of the first embodiment of the present invention.
Figure 3B:
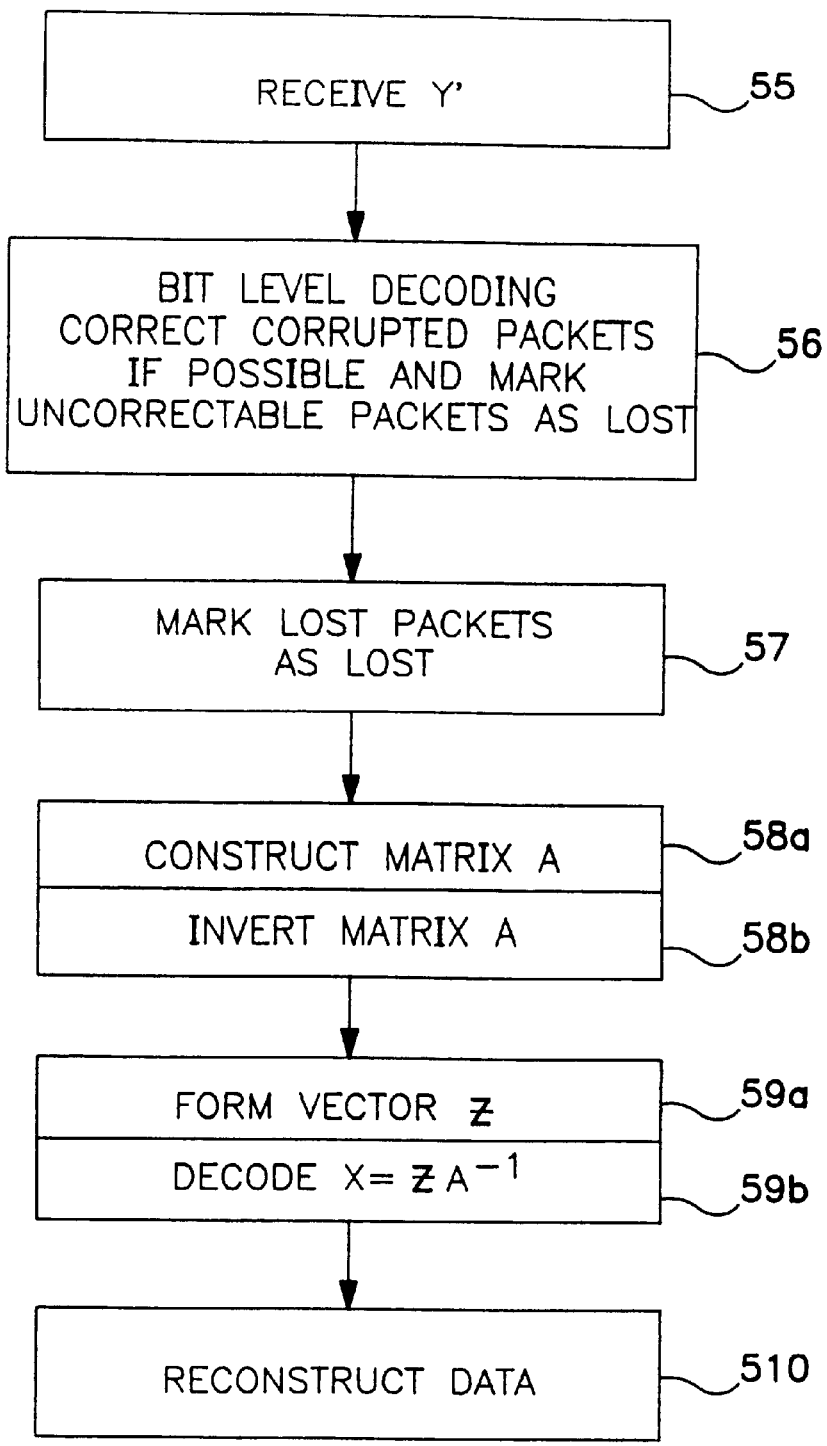

The file error-correcting coding method of the first embodiment is shown in the flowcharts of FIGS. 3A and 3B. In step S1, the file X is divided into k packets, $X_1, X_2, X_3, \ldots, X_k$, where each packet $X_i$ is a fixed-length sequence of j symbols (a symbol being a sequence of one or more bits, typically a byte) defined over a finite field F (boldface type denotes a vector or matrix quantity, or a field, and non-boldface type denotes a scalar quantity).

Two examples of field F are $Z_P$, the set of integers modulo a prime number P, and $GF[q^r]$, a Galois field of size $q^r$, where q is a prime number and r is an integer. In field $Z_P$, all the addition and multiplication between field elements is done modulo-P. In the field $GF[q^r]$, field elements are interpreted as polynomials and addition and multiplication are performed as polynomial addition and multiplication modulo a primitive polynomial of degree equal to r.

For example, symbol $x_{ij}$ of packet $X_i$ can be any one of the elements of the Galois field $GF[2^8]$ (an integer in the range of 0–255, or as implemented on a computer, a byte). All operations involved in the matrix multiplications in the steps below are element additions and multiplications defined over the field F as stated in the above paragraph, and are thus not regular integer additions and multiplications. Returning to the example, the addition of two bytes "a" and "b" of the Galois field $GF[2^8]$ is the exclusive-OR of each bit of byte "a" with the corresponding bit of byte "b". The result of this addition is another byte "c" of the Galois field $GF[2^8]$.

In step S2 (steps S2a–S2c), X is encoded into the codefile Y that is transmitted by the host computer to the subscriber computers, as follows. In substep S2a, the first symbols, $x_{ij}$, from each of the packets $X_i$, i=1, 2, ..., k, are used to form a message vector $x_1$ of length k. Thus, $x_1 = (x_{11}, x_{21}, x_{31}, \ldots, x_{k1})$.

In step 2b, message vector $x_1$ is encoded to form the codeword vector $y_1 = (y_{11}, y_{21}, y_{31}, \ldots, y_{n1})$ of length n, where each symbol in the codeword vector is an element of field F. Also, n is the total number of transmitted packets, is greater than k, the number of original packets, and is determined beforehand, as follows.

If p is the percentage of packets that will be lost during transmission due to noise, then p times n is the total number of packets that will be lost. To guarantee perfect file delivery, the number of correctly received encoded packets, n−p*n, must be greater than or equal to the number of original packets, k, or solving for n:

$$n >= \text{ceil}[k/(1-p)] \qquad (1),$$

where ceil[q] is the ceiling function that rounds up a real number q to the next highest integer.

Thus, if p can be accurately estimated based on familiarity of the channel by the operator of the host computer, n can be calculated from equation (1) to ensure perfect message delivery. Of course, if p is underestimated by the operator, then the number of packets received correctly will be less than k and the original file X cannot be recovered. Notably, by allowing p to be adjusted on a transmission-by-transmission basis, each transmitted file can be made to contain the minimum number of packets necessary to ensure the file's perfect reconstruction by the receiver. This allows the operator to minimize the bandwidth consumed by the system on a transmission-by-transmission basis. For example, if p is 5% and k=100, then the smallest possible value for n is 106. Thus the number of encoded packets is only six more than the number or original packets.

To form message vector $x_1$ into the codeword vector $y_1$, message vector $x_1$ is matrix multiplied on the right by a code generator matrix G as follows:

$$y_1 = x_1 G \qquad (2).$$

G is defined as a k (row)×n (column) matrix, where n>k, and the elements of G are also defined over field F. G defines a linear block code and is thus called the code generator matrix of that code. In the present invention, G must have the property that any k out of its n columns are linearly independent. One such matrix G is the Vandermonde matrix, shown in FIG. 4. For any pair of integers k and n, where n>k, a Vandermonde matrix can be generated from n distinct elements of field F, $g_1, g_2, g_3, \ldots, g_n$ (n must be less than the number of elements in field F). The rows of the Vandermonde matrix are simply the powers of $g_1, g_2, g_3, \ldots, g_n$ from 0 to k−1. One way to generate n distinct elements of F, that is, $g_1, g_2, g_3, \ldots, g_n$, is by starting from a primitive element b of F and taking successive powers of b, that is $b^0$, $b^1, b^2, b^3, \ldots$ These powers of b eventually cover all of the non-zero elements of F before they start repeating.

In step S2c, $y_{i1}$ becomes the first symbol of each respective packet $Y_i$, i=1, 2, ..., n. Steps S2a–S2c are looped through for all the j symbols of packets $X_i$. For example, the second symbol, $x_{i2}$, of each of the packets $X_i$, i=1, 2, ..., k, is used to form a message vector $x_2$ of length k, which is encoded into codeword vector $y_2=(y_{12}, y_{22}, \ldots, y_{n2})$ by using equation (2). Symbols $y_{i2}$ of codeword vector $y_2$ are then used to form the second symbol of each packet $Y_i$, i=1, 2, ..., n, and so on. Of course, these operations need not be carried out in this fashion—for example, all message vectors may be assembled first, and all codeword vectors are then sequentially computed by equation (2).

As an extra level of protection against white noise, the individual symbols y, within the packets Y of code file Y are encoded at the bit level using standard EDAC encoding schemes, such as a Reed-Solomon code, in step S3 of the present invention. Bit-level encoding can be done by the host computer, by the satellite transmitter device or by the satellite uplink. Independent of error correction, data compression and encryption methods may also be applied to the data prior to transmission.

In step S4, the codefile Y is transmitted to the subscriber computers using packet-based broadcast protocols. Codefile Y has n-k additional packets than the original file X and thus requires more bandwidth than the original file.

In step S5, any one of the subscriber computers receives a sequence of packets $Y'_i$, i=1, 2, ..., n, which are the packets of codefile Y corrupted by the noise channel. In step S6, EDAC decoding is performed by the satellite receiver device or the subscriber computer to detect and correct, if possible, bit-level errors within the Y' packets. Because the transmission channel may also cause burst errors, one or more of the transmitted packets may be lost or may be received with so many bit errors that the EDAC decoding cannot correct them. In either case, in steps S6 and S7, those packets $Y'_i$ which are EDAC uncorrectable (step S6) or lost (step S7) are marked with the special symbol Δ indicating they are lost. Because the transmitted packets are sequentially numbered, for example, with serial numbers, the subscriber computer can easily detect which packets were correctly received and which packets were lost. Thus $Y'_i=Y_i$, if the packet is received correctly, or $Y'_i=\Delta$, if the packet is lost.

If the number of Y' packets correctly received are greater than or equal to the number of original packets, then the original file X can be recovered in steps S8a, S8b, S9a and S9b. In step S8a, a k×k matrix A is constructed by removing from the code generator matrix G all columns corresponding to the positions of the Δ packets in Y', and by removing any additional columns (corresponding to positions of correctly received packets) so as to form a k×k square matrix. For example, if k=7 and n=10, and if the third and fifth packets were lost, then the third and fifth columns must be removed, and one more good column, such as the tenth column, from matrix G to form matrix A. Note that the choice of the tenth column is arbitrary, since any one of the columns corresponding to the position of a correctly received packet could have been removed instead. Note also that eight packets were correctly received, which is greater than the number of original packets (7).

In step S8b, matrix A is inverted to $A^{-1}$. Because any k columns of G are linearly independent, A always has full rank, that is, A is non-singular, and thus can be inverted to matrix $A^{-1}$. Note that the matrix formation step S8a and matrix inversion step S8b need only be computed once for a given file transfer, since $A^{-1}$ can be used repeatedly in step S9b below for computation of all of the message vectors required to reconstruct the original packets of the file.

In step S9a, the first k symbols $y'_{i1}$, from the correctly received packets $Y'_i$ used to form A, are used to form a vector $z_1$ of length k. In the example above, $z_1$ will equal $(y'_{11}, y'_{21}, y'_{41}, y'_{61}, y'_{71}, y'_{81}, y'_{91})$. In step S9b, the message vector $x_1$ of length k is recovered from $z_1$ as follows:

$$x_1 = z_1 A^{-1} \quad (3).$$

$X_{i1}$ is the recovered first symbol from the original packet $X_i$, for all i=1, 2, ... k. Steps S9a and S9b are looped through until all j symbols forming the original packets X have been recovered. For example, $z_2$ is formed next, then $x_2$ is computed by using equation (3), then $z_3$ and $x_3$, etc., and finally $z_j$ and $x_j$, thus recovering all of the symbols of original file X. The order of formation of the vectors z may be changed. For example, all vectors $z_1, z_2, \ldots, z_j$ may be formed first, then all message vectors $x_1, x_2, \ldots, x_j$ are computed. In step S10, the data file is reassembled from recovered packets X.

Thus, the data file can be distributed error-free by the host computer to the subscriber computers as long as the number of packets correctly received is greater than or equal to the number of original packets.

In one particular implementation of the first embodiment of the present invention, the order in which vector-matrix operations are performed during encoding and decoding is changed to improve the overall efficiency of the error correcting method.

Suppose that G is the chosen generator matrix, and $g_{ij}$ is the element of G in the intersection of row i and column j, where i=1, 2, ..., k and j=1, 2, ..., n.

The encoded packets $Y_i$, i=1, 2, ..., n are formed in k iterations. During the jth iteration, a set of n contribution packets $C_{ji}$, i=1, 2, ..., n, is computed from the jth original packet. Those contribution packets have the property that the ith encoded packet $Y_i$ is equal to the sum of the k contribution packets $C_{ji}$, j =1, 2, ..., k. More specifically, the element of position t of encoded packet $Y_i$ is equal to the sum of all the elements in the t positions of the contribution packets $C_{ji}$, j=1, 2, ..., k:

$$Y_i = \Sigma^k_{j=1} C_{ji}.$$

The contribution packets $C_{ij}$ are computed as follows. In the first iteration, the first original packet is multiplied by $g_{11}$ to form the first contribution packet $C_{11}$ of the first iteration. More specifically, the element in the position t of the first contribution packet $C_{11}$ of the first iteration is equal to the element in the t position of the first original packet multiplied by $g_{11}$. Similarly, the first original packet is multiplied by the element $g_{12}$ to form the second contribution packet $C_{12}$ of the first iteration. In general, the first original packet is multiplied by $g_{1m}$ to form the mth contribution packet $C_{1m}$ of the first iteration, m=1, 2, ..., n. In general, in the jth iteration, the jth original packet is multiplied by $g_{j1}$ to form the first contribution packet $C_{j1}$ of the jth iteration. More specifically, the element in the t position of the first contribution packet $C_{j1}$ of the jth iteration is equal to the element in the t position of the jth original packet multiplied by $g_{j1}$. Similarly, the jth original packet is multiplied by the element $g_{j2}$ to form the second contribution packet $C_{j2}$ of the jth iteration. In general, the jth original packet is multiplied by $g_{jm}$ to form the mth contribution packet $C_{jm}$ of the jth iteration, m=1, 2, . . . , n.

The encoded packets $Y_i$ are formed incrementally from the contribution packets. More specifically, their elements are initialized to zero before the first iteration, and at the end of each iteration, the contribution packets computed during that iteration are added to the current encoded packets. In this way, at the end of all iterations, the encoded packets are equal to the sum of the corresponding contribution packets from all the iterations.

Assuming that the k original packets are stored consecutively in a permanent storage device and that the encoded packets will also be stored in a similar way, the above-described order of computation constitutes an improvement over the method of computation of the first embodiment, that is, when the encoded packets are formed by the y vectors. In particular, collecting the elements that form the x vectors from the original packets and redistributing the elements of the y vectors to the encoded packets requires a very large number of seek operations on the permanent storage device in which the original and the encoded packets are stored. Such seek operations in the permanent storage device tend to be costly.

In the above-described improved order of computation, only one sequential pass over the original packets (no seeks) is required, since the original packet j is processed in full during the jth iteration and is not needed in any of the previous or following iterations. Further, a maximum of k sequential passes (k-1 seeks) over the encoded packets is necessary corresponding to the k iterations explained above. Thus, the improved order of computation significantly reduces the amount of seeks in the storage devices used and makes encoding more efficient. The efficiency of decoding can also be improved in a similar fashion.

In the second embodiment of the present invention, the first k encoded packets are the same as the k original packets. To ensure that the first k encoded packets are the same as the original packets, the code generator matrix G must be transformed to standard form through row operations, so that the left k×k submatrix of G is the identity matrix, that is, a submatrix with ones on its diagonal and zeros everywhere else, as shown in FIG. 5. If $x_j$ is matrix multiplied on the right by G to generate $y_j$, then $$y_{ij}=x_{ij} \text{ for } i=1, 2, 3, \ldots, k.$$

As it is apparent, multiplication by the k×k identity submatrix need not be performed. Thus, only multiplication by the remaining k×(k-n) submatrix of G need be performed to form the last n-k encoded packets, saving time and storage space during encoding, thus making encoding more efficient.

On the receiving side, in the case where the first k packets are received correctly, there is no need for decoding since the first k received packets are exactly the same as the k original packets and the last k-n packets can be ignored. That is, if none of the first k packets is lost, $$y'_{ij}=x_{ij} \text{ for } i=1, 2, 3, \ldots, k.$$

Thus, the above-described decoding steps S8a, S8b, S9a and S9b, including the inversion of matrix A, need not be performed to recover the original packets X, thus making decoding more efficient.

Consider, for example, a digital file consisting of k=7 original packets of 1024 bytes each. This file is encoded using the second embodiment of the present invention with p=30% expected packet loss, yielding a sequence of n=10 encoded packets of 1024 bytes each. The encoding uses the Galois field $GF[2^8]$ represented by the polynomial $x^8+x^4+x^3+x^2+1$, and the Vandermonde matrix V shown in FIG. 6A. After transformation to standard form, V yields generator matrix G shown in FIG. 6B.

If $x_1$=(123, 55, 2, 96, 197, 0, 73) is the message vector formed from the first byte (equivalent to an integer in the range 0–255) of each one of the original 7 packets, then $y_1$=(123, 55, 2, 96, 197, 0, 73, 162, 173, 3) is the codeword vector formed by the first byte of each of the encoded 10 packets, where $y_1=x_1G$. Note that because G is in standard form, the first 7 bytes of y are equal to the 7 bytes in x.

The encoded packets are transmitted in sequence over a satellite transmission channel to a large number of subscriber computers. Subscriber computer C correctly receives encoded packets 1, 3, 5, 6, 7, 9 and 10, but misses encoded packets 2, 4 and 8. As the number of correctly received packets is equal to the number of original packets, the original file can be reconstructed from the correctly received packets as follows. Matrix A, shown in FIG. 6C, is formed from the generator matrix G with columns 2, 4 and 8, corresponding to the serial numbers 2, 4 and 8 of the lost packets, removed. Matrix A is inverted to form matrix $A^{-1}$, shown in FIG. 6D.

Vector $z_1$=(123, 2, 197, 0, 73, 173, 3) is the vector of the first byte of each one of the correctly received packets, that is, $z_1$ is equal to $y_1$ without bytes 2, 4 and 8 which were lost in transmission. The original $x_1$=(123, 55, 2, 96, 197, 0, 73) is recovered by multiplying $z_1$ by $A^{-1}$ on the right. Bytes 2–1024 of all the original packets can be recovered in similar fashion. The original file can then be reconstructed from the recovered original packets. Notably, if transmitted packets 1, 2, . . . , 7, corresponding to the original packets, were all correctly received, then there would be no need for decoding. In this case, whether or packets 8, 9 and 10 are correctly received is immaterial.

As the size of the file to be transferred increases, k and n increase, and the file error-correcting methods of the first and second embodiments become increasingly more inefficient because of the greater difficulty of inverting a large k×k matrix A. Moreover, once the underlying finite field F is fixed, then the choices for k and n are limited by the size of the field F.

Figure 7:
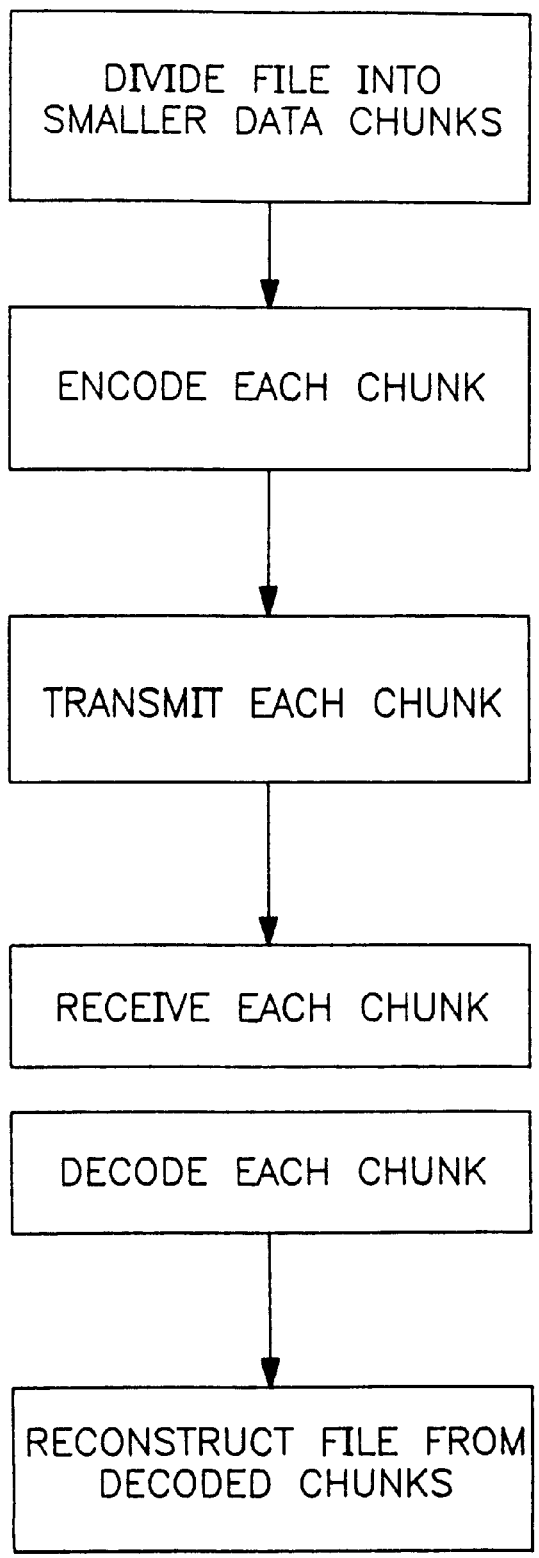
FIG. 7 depicts a flowchart of the third embodiment of the present invention.

In the third embodiment of the present invention, large files are divided into "chunks", smaller groups of packets, that can be independently encoded and decoded, as shown in the flowchart of FIG. 7. Each chunk is encoded, transmitted, received and decoded separately, by the methods of the first or second embodiments. The large file is then reassembled by the subscriber computer from the recovered chunks.

A more preferable method for transferring large files is provided by the fourth embodiment of the present invention. The above-described third embodiment has less error-correcting ability against burst errors than the first and second embodiments from which it was derived. In particular, there are cases in which the subscriber computer may receive a number of encoded packets larger than the number of original packets, but cannot recover the original file. For example, consider the case of an 800-packet original file divided into 8 chunks of 100 packets each and encoded with 20% error correction yielding encoded chunks of 125 packets each. Those chunks are transmitted in sequence as in the third embodiment. Then, a single burst error yielding a 20% packet loss wipes out 200 consecutive packets of the total 1000 packets transmitted. Because the chunks were transmitted sequentially, at least one chunk will be completely lost, thus making recovery of the original file impossible.

By rearranging the encoded packets of the different chunks in such a way that they are spread out uniformly over the transmission, the error correcting ability of the third embodiment to recover from burst errors is significantly improved. This is accomplished by packet interleaving. As in the third embodiment, the large file is divided into manageable chunks. In the fourth embodiment, however, the packets of the various chunks are transmitted in an interleaved fashion. In particular, once the chunks $S_1, S_2, \ldots, S_j$ have been formed, each chunk is encoded using the method of the first or second embodiment to generate encoded packets for each one of the chunks. Those encoded packets are then transmitted as follows. The first encoded packet of each chunk is transmitted first. Then, the second encoded packet of each chunk is transmitted, and so on until the jth packet of each chunk is transmitted at the end.

Upon reception by a subscriber computer, the received sequence of encoded packets is deinterleaved and the encoded packets of each chunk are grouped together. Each chunk is then decoded separately and the original large file is reconstructed from the encoded chunks. Returning to the previous example, where an 800-packet file is encoded with 20% error correction, the 20% packet loss that wipes out 200 consecutive packets would kill exactly 25 packets in each one of the 8 chunks. As there are exactly 100 correctly received packets in each chunk, all chunks can be error corrected, and the original file can be reconstructed from the recovered chunks. Hence, the error correcting ability of the fourth embodiment against burst errors is significantly higher than that of the third embodiment.

Figure 8A:
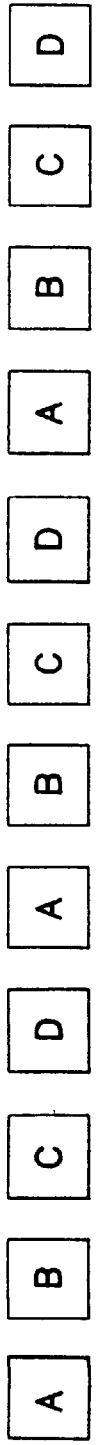
FIGS. 8A–8D depict an example of the third and fourth embodiments of the present invention.
Figure 8B:
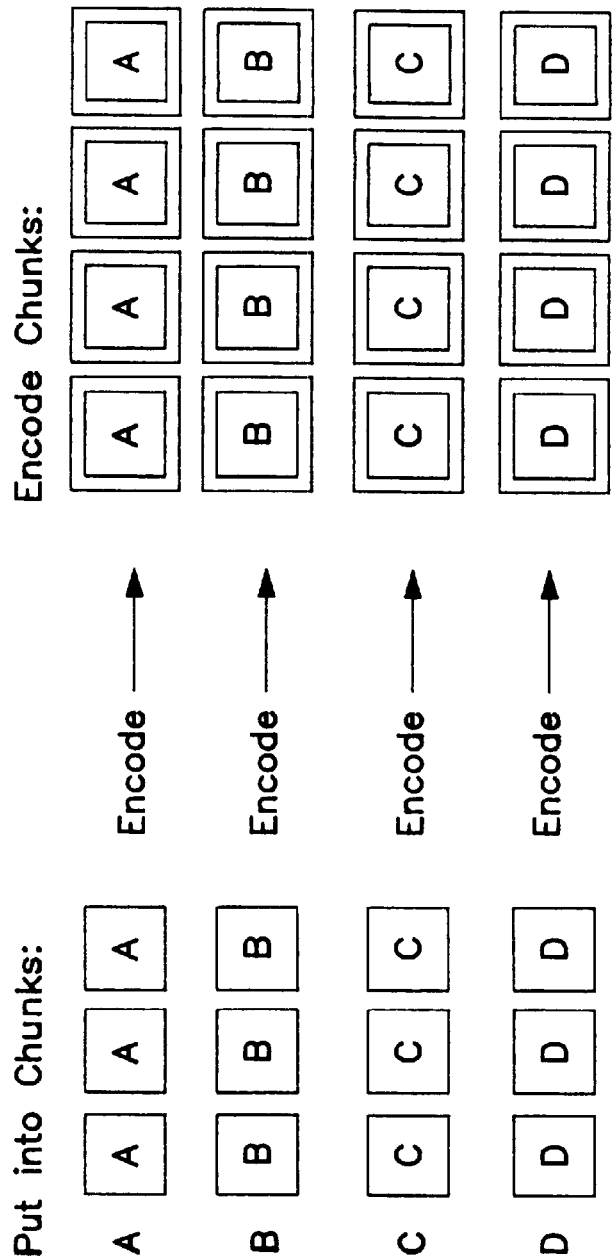

Another example of the benefit of using packet interleaving is shown in FIGS. 8A–8D. The original file is broken into 12 packets as shown in FIG. 8A. The packets are organized into chunks A, B, C and D of 3 packets each, and each chunk is then encoded with one extra packet (25% of total), as shown in FIG. 8B. The encoded packets may then be transmitted in sequential order (as in the third embodiment), or they may be transmitted in an interleaved fashion (as in the fourth embodiment), as respectively shown in FIGS. 8C and 8D (ignoring the cross-out lines).

Figure 8C:
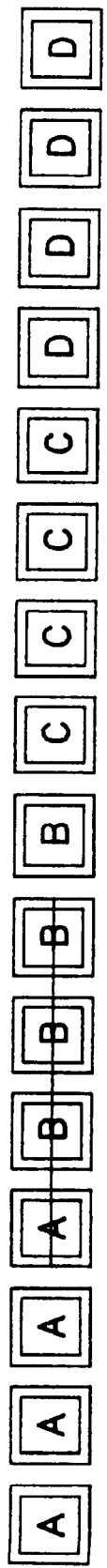
Figure 8D:

The cross-out lines of FIGS. 8C and 8D respectively show the packets lost during transmission because of burst noise. The burst error destroys 4 consecutive packets, that is, 25% of the total number of transmitted packets (16). In the case where the packets were transmitted using the third embodiment, the burst error destroyed 75% (3) of the packets of chunk B, as shown in FIG. 8C. Because chunk B was encoded with 25% expected packet loss, chunk B could not be recovered and thus the original file could not be recovered. In the case where the packets were transmitted using the fourth embodiment, however, the burst error destroyed only 25% (1) of the packets of each chunk A, B, C and D, as shown in FIG. 8D. Thus, all four chunks could be recovered, and the original file could be reconstructed from the recovered chunks. Therefore, the error correcting ability against burst errors is greater when using interleaving.

In one particular implementation of the fourth embodiment, a large digital file is divided into chunks as follows. If K is the largest number of original packets that can be handled in the first or second embodiments, a large file having more than K original packets must be split into m chunks, where m is a positive integer with m>1, each chunk containing at most K packets. Thus, the original file contains at most m*K packets. The first chunk $S_1$ is constructed from every mth packet of the file starting with the first packet (thus, for example, if m=5, K=4, chunk $S_1$ would consist of original packets with serial numbers 1, 6, 11, and 16). The second chunk is constructed from every mth packet of the large file starting with the second packet (continuing the example, chunk $S_2$ would consist of original packets with serial numbers 2, 7, 12, and 17). In general, the jth chunk $S_j$ is constructed from every mth packet of the large file starting with the jth packet, where j=1, 2, . . . , m.

The method of the third embodiment represents no interleaving, while the method of the fourth embodiment represents maximal interleaving. One skilled in the art would recognize that interleaving may be performed at various degrees between those two extremes. For example, the encoded packets of each chunk could be transmitted in pairs. More specifically, the first two packets of the first chunk would be transmitted first, followed by the first two packets of the second chunk, and so on until the first two packets of the last chunk have been transmitted. Then, the second two packets of the first chunk would be transmitted followed by the second two packets of the second chunk, and so on until the second two packets of the last chunk have been transmitted. This interleaving of packet pairs would continue in the same way until the last two packets of all chunks have been transmitted.

Figure 9:
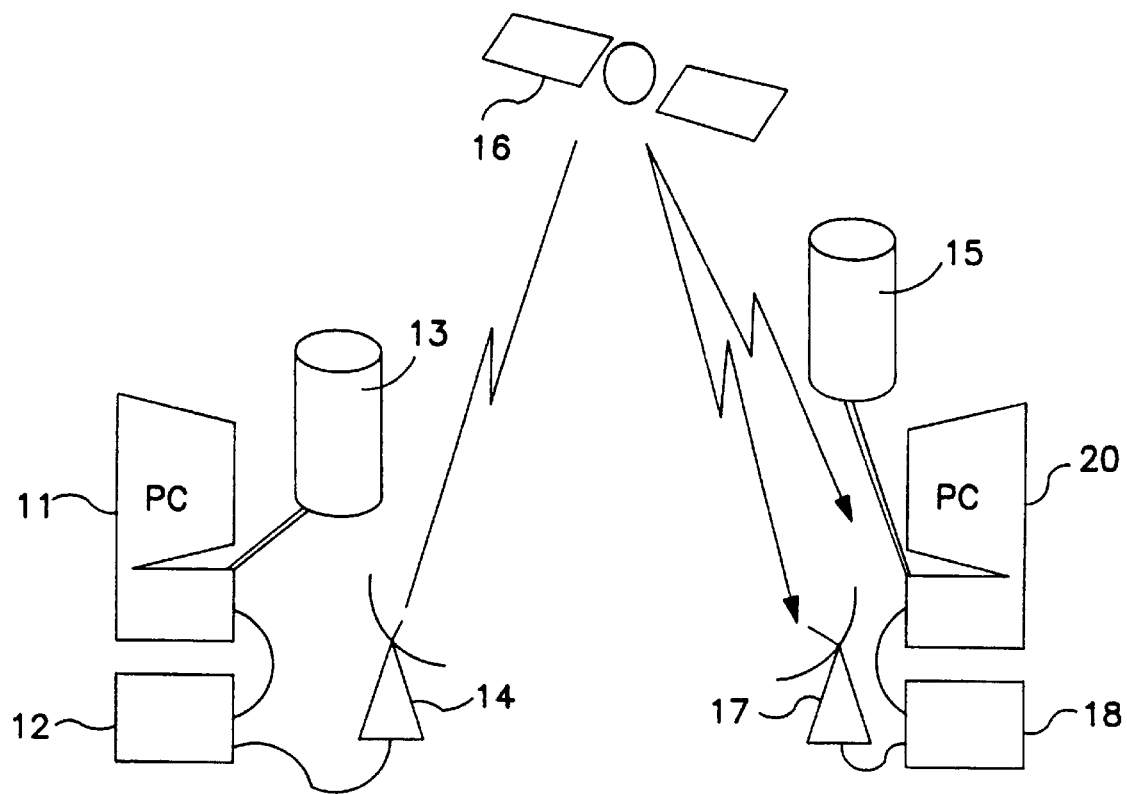
FIG. 9 depicts a file transfer system according to the fifth embodiment of the present invention.

A block diagram of a reliable packet-based data transfer system is shown in FIG. 9. This system includes a host computer 11, usually a PC. The host computer 11 includes or is extended with a transmission communication device 13 for the transfer of data outside the computer. The communication device can take the form of a serial card or a computer chip. The communication device 13 is connected by a cable to a satellite transmitter device 12. The satellite transmitter device 12, through an attached uplink antenna 14, broadcasts the encoded data packets to one or more subscriber computers 20 via satellite 16.

The encoded packets are received by a downlink antenna 17 (usually submeter in diameter) attached to a satellite receiver device 18, which in turn is connected to subscriber computer 20, usually a PC. The subscriber computer 20 includes or is extended with a reception communication device 15 to transfer the received packets into the subscriber computer.

The file error-correcting methods of the first through fourth embodiments may be implemented (1) by computer software, (2) by dedicated hardware, or (3) by combinations of software, hardware and firmware. The computer software may run on a Windows® 3.11 or Windows® NT® operating system. The software preferably runs on a Pentium® 133 MHz PC or better with at least 16 Mbyte RAM and a 1 Gbyte hard drive for storage of the large digital objects.

An example of computer software implementing an embodiment of the present invention as described above is shown in the "UU-encoded" object code of FIGS. 10A–10N. The UU-encoded object code is created from binary object code, output from a "C++" language (Microsoft® Visual C++®, Version 1.52) compiler, by transforming every 6 bits into a symbol from a reduced ASCII set of symbols, as is well-known in the art. The UU-encoded object code may be changed back into binary object code by transforming the symbols into their corresponding six bits. FIGS. 10A–10H show the UU-encoded object code for encoding the original packets on the transmitting side of the system, and FIGS. 10I–10N show the UU-encoded object code for decoding the received packets on the receiving side of the system. This object code, in its binary form, will run on IBM and IBM-compatible PCs using a Windows® 3.1 or Windows® 3.11 operating system.

In addition to the high speed transmission communication device, the host computer may be set up with a relational database, a graphical user interface, and list/addressing software and transmission communication software to communicate with the transmission communication device. Data files are transmitted and received using a packet-based broadcast protocol at speeds of over 8.44 Mbps in a dedicated computer. In addition to the high speed receiver communication card, the subscriber computer may be set up with a local database, a graphical user interface and receive communication software to communicate with the receiver communication device.

Moreover, the packets may be encoded using a computer separate from the host computer. In this case, the host computer is responsible for transmitting the encoded packets. Similarly, the received packets may be received by the subscriber computer and then decoded using a separate computer.

Any type of digital file may be transmitted and received. These files may include, but are not limited to, video files (MPEG, M-JPEG), electronic documents (PDF), color images (TIF), press clippings, interactive training (CD-I, CD-ROM), news feeds, music and audio (WAV), compound documents, and other multimedia files.

Figure 1:
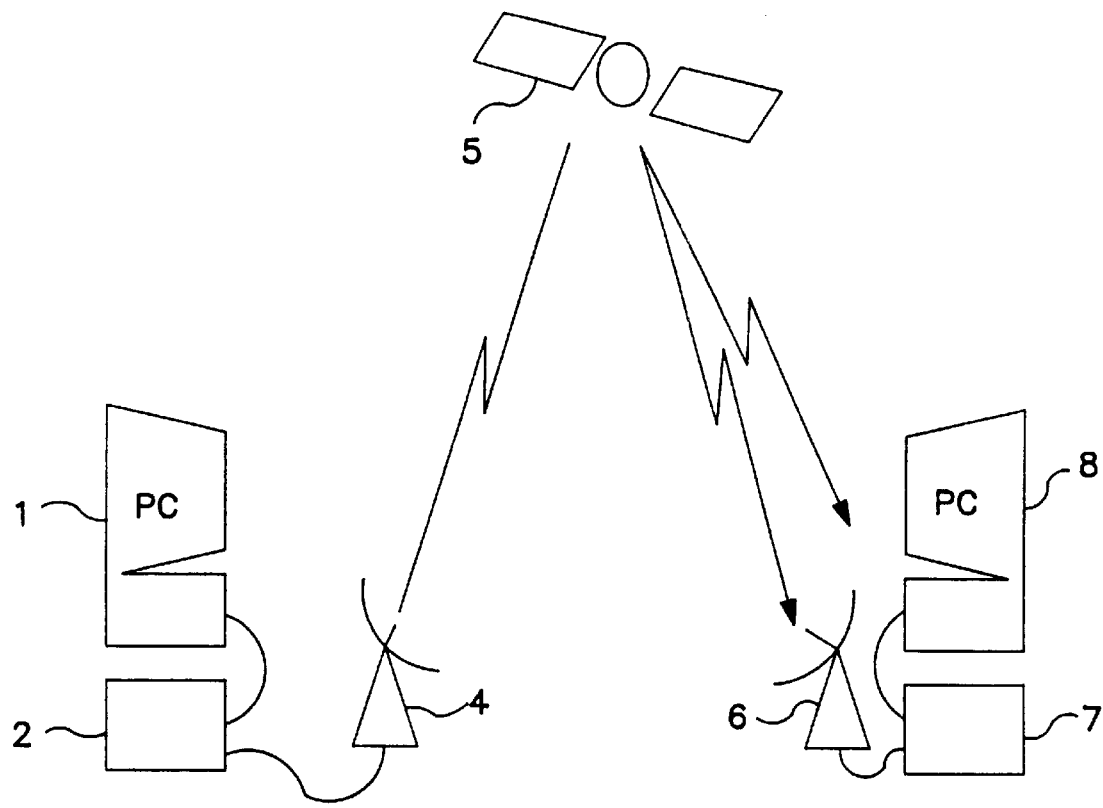
FIG. 1 depicts a block diagram of conventional one-way broadcast satellite system.
Figure 2:
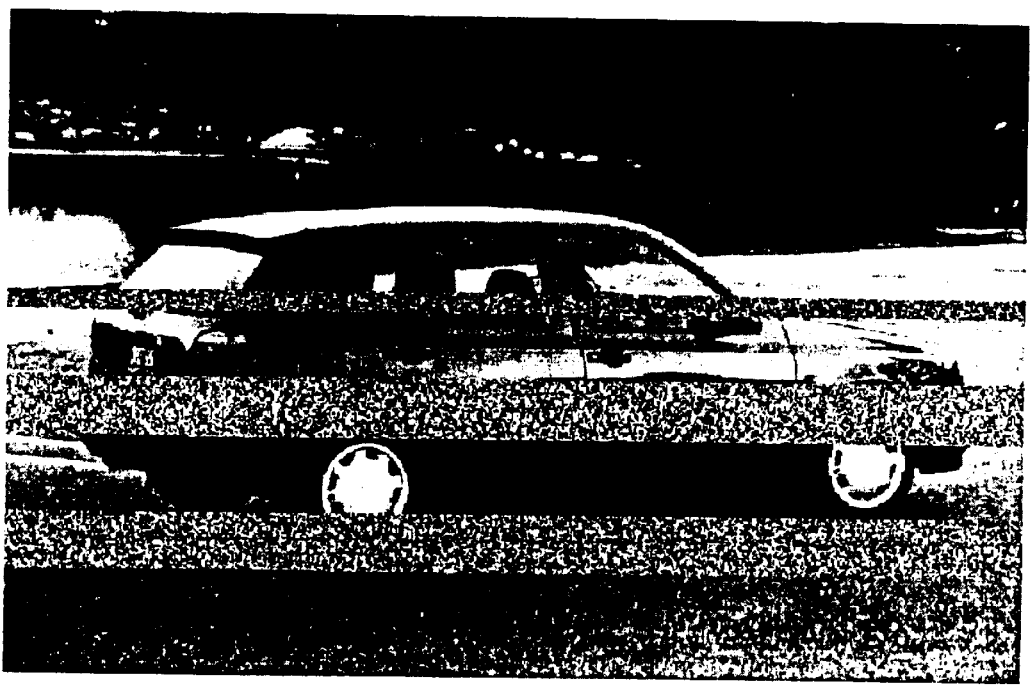
FIG. 2 depicts a still image showing the effect of burst noise on transmission of that image.
Figure 11:
FIG. 11 depicts the still image, corresponding to that shown in FIG. 2, error-corrected by the fifth embodiment of the present invention.
Figure 13:
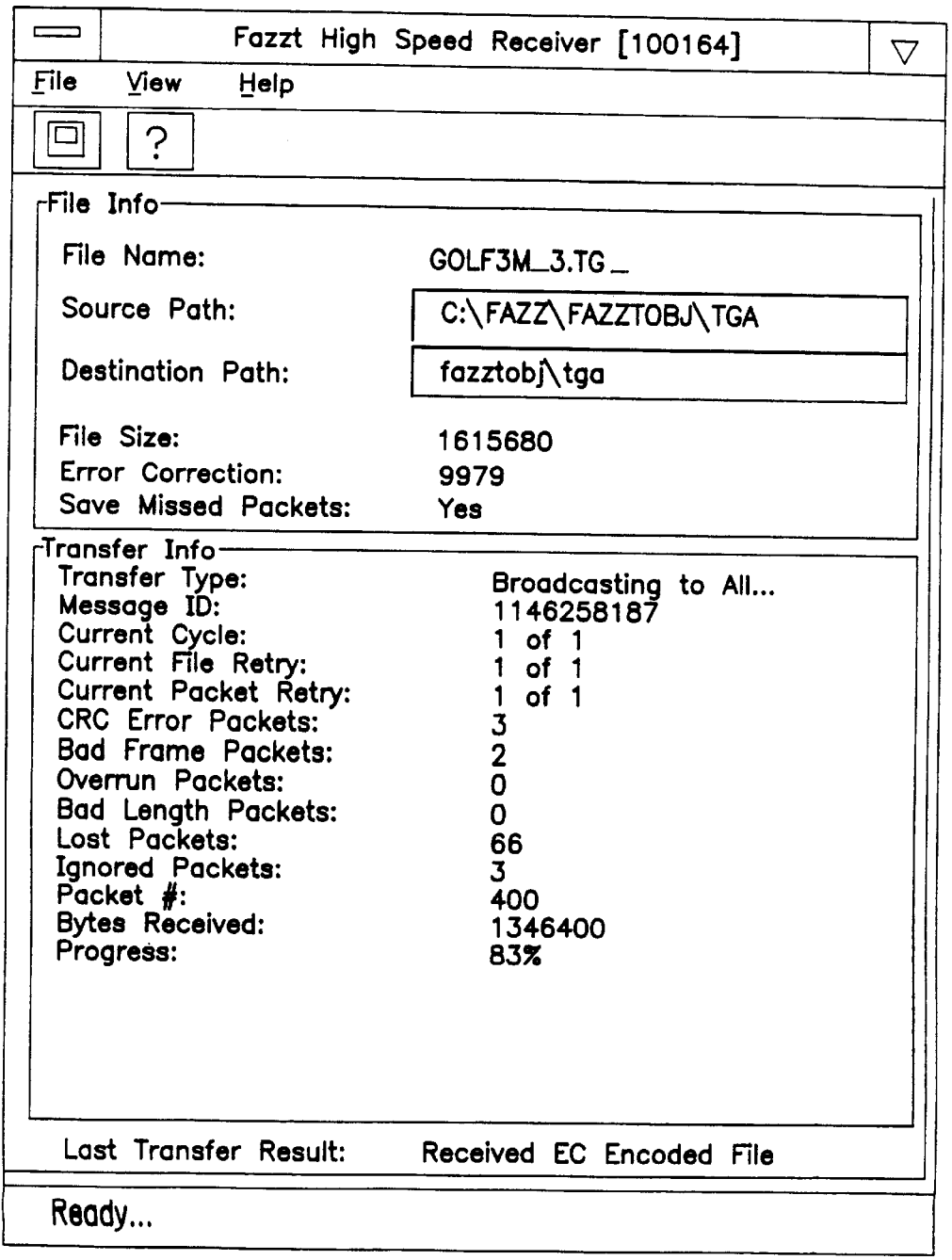
FIG. 13 depicts receiving side information for the still image shown in FIG. 11, received by the fifth embodiment of the present invention.

An example of a digital image encoded, transmitted, received damaged and successfully decoded using the present invention of the fifth embodiment is shown in FIG. 11. This image corresponds to the image shown in FIG. 2. In FIG. 11, the received packets have been decoded using the present invention and all of the original packets have been recovered, allowing the original image to be reconstructed successfully. Transmission-side information and receiving-side information relating to the image of FIG. 11 are respectively shown in FIGS. 12 and 13.

Of course, it will be appreciated that the invention may take forms other than those specifically described, and the scope of the invention is to be determined solely by the following claims.

What is claimed is:

1. A method for transferring data from a host computer to at least one subscriber computer, the data comprising a plurality of k original packets, where k is a positive integer, said method comprising the steps of:

encoding the k original packets to form a plurality of n encoded packets, where n>k;

transmitting the encoded packets from the host computer to the at least one subscriber computer; and decoding any combination of k correctly-received encoded packets to reconstruct the k original packets, wherein the original packets are encoded with a k×n code generator matrix and the left k×k submatrix of the k×n code generator matrix is the identity matrix, so that the first k encoded packets are the original k packets, and thus if the first k encoded packets are received correctly, the decoding step is not performed, and wherein n is recomputed for each transmission based on an estimate of the percentage of packets expected to be lost during that transmission.

2. A method for transferring data from a host computer to at least one subscriber computer, the data comprising a plurality of k original packets, where k is a positive integer, said method comprising the steps of:

dividing the original k packets into a plurality of groups of l packets;

separately encoding each group of l packets to form a plurality of n' encoded packets for each group, where n'>l, and wherein n' is recomputed for each transmission based on an estimate of the percentage of packets expected to be lost during that transmission;

separately transmitting each group of encoded packets from the host computer to the at least one subscriber computer;

receiving, for each transmitted group, at least some of the transmitted packets;

separately decoding any combination of l correctly-received encoded packets for each group to reconstruct the l original packets of each group so as to form a plurality of decoded groups;

reconstructing the file from the plurality of decoded groups.

3. A method for transferring data from a host computer to at least one subscriber computer, the data comprising a plurality of k original packets, where k is a positive integer, said method comprising the steps of:

dividing the original k packets into a plurality of groups of l packets;

separately encoding each group of l packets to form a plurality of n' encoded packets for each group, where n'>l;

transmitting the encoded packets of all the groups in an interleaved fashion from the host computer to the at least one subscriber computer;

receiving at least some of the transmitted packets within each group in a deinterleaved fashion;

separately decoding each group by using any combination of l correctly-received packets of the group to reconstruct the l original packets of each group, so as to form a plurality of decoded groups; and reconstructing the data from the plurality of decoded groups.

4. A method according to claim 3, wherein the packets are transmitted in a maximally interleaved fashion.

5. A method for transferring data from a host computer to at least one subscriber computer, said method comprising the steps of:

(1) dividing the data into k original packets X, each original packet comprising j symbols from a finite field F;

(2) forming j message vectors x each of length k, the $a^{th}$ message vector being formed by taking the $a^{th}$ symbol from each of the k original packets X in sequence;

(3) matrix multiplying each of the j message vectors x by a code generator matrix G on the right to form j codeword vectors y each of length n, the code generator matrix G being a k row×n column matrix defined over the finite field F, where n>k and any k columns out of the n columns are linearly independent;

(4) forming n encoded packets Y, each encoded packet comprising j symbols, from the j codeword vectors y, the $b^{th}$ coded packet being formed by taking the $b^{th}$ symbol from each of the j codeword vectors y in sequence;

(5) transmitting the encoded packets Y from the host computer to the at least one subscriber computer;

(6) receiving Y' packets of the encoded packets Y by the at least one subscriber computer;

(7) determining which and how many of the received packets Y' have no error;

(8) if the number of received packets having no error is greater than or equal to k, forming a matrix A of k rows and k columns that comprises the columns from the code generator matrix G that correspond to k packets received without error;

(9) inverting the matrix A to form an inverted matrix $A^{-1}$;

(10) forming j vectors z from the k packets received without error used in step (8), the $c^{th}$ vector z being formed by taking the $c^{th}$ symbol from each of the k packets Y in sequence;

(11) matrix multiplying each of the j vectors z by the inverted matrix $A^{-1}$ on the right to form the j message vectors x of step (2);

(12) reconstructing the k original packets X from the j message vectors x of step (11), the $d^{th}$ original packet being formed by taking the $d^{th}$ symbol from each of the j message vectors x in sequence; and

(13) reconstructing the original data of step (1) from the k original packets X of step (12).

6. A method according to claim 5, wherein the symbols within the coded packets Y are also error detection and correction encoded before transmission and decoded after reception.

7. A method according to claim 5, wherein the left k×k submatrix of the code generator matrix G is the identity matrix.

8. A system for transferring data from a host computer to at least one subscriber computer, the data comprising a plurality of k original packets, where k is a positive integer, said system comprising:

an encoder for encoding the k original packets to form a plurality of n encoded packets, where n>k;

a transmitter for transmitting the encoded packets from the host computer to the at least one subscriber computer;

a receiver for receiving at least some of the transmitted packets; and a decoder for decoding any combination of k correctly-received encoded packets to reconstruct the data, wherein the original packets are encoded with a k×n code generator matrix and the left k×k submatrix of the k×n code generator matrix is the identity matrix, so that the first k encoded packets are the original k packets, and thus if the first k encoded packets are received correctly by the receiver, no decoding is performed by the decoder, and wherein n is recomputed for each transmission based on an estimate of the percentage of packets expected to be lost during that transmission.

9. A system according to claim 8, wherein said encoder is a processor and the encoding is performed by a computer program stored in a storage medium accessed by said processor.

10. A system according to claim 9, wherein the processor is within the host computer.

11. A system according to claim 8, wherein said decoder is a processor and the decoding is performed by a computer program stored in a storage medium accessed by said processor.

12. A system according to claim 11, wherein the processor is within the at least one subscriber computer.

13. A system according to claim 8, wherein said transmitter is a satellite broadcast transmitter.

14. A system for transferring data from a host computer to at least one subscriber computer, the data comprising a plurality of k original packets, where k is a positive integer, said system comprising:

dividing means for dividing the original k packets into a plurality of groups of 1 packets;

an encoder for separately encoding each group of 1 packets to form a plurality of n' encoded packets for each group, where n'>1, and wherein n' is recomputed for each transmission based on an estimate of the percentage of packets expected to be lost during that transmission;

a transmitter for separately transmitting each group of encoded packets from the host computer to the at least one subscriber computer;

a receiver for receiving, for each transmitted group, at least some of the transmitted packets;

a decoder for separately decoding any combination of 1 correctly-received encoded packets for each group to reconstruct the 1 original packets of each group so as to form a plurality of decoded groups; and reconstructing means for reconstructing the file from the plurality of decoded groups.

15. A system for transferring data from a host computer to at least one subscriber computer, the data comprising a plurality of k original packets, where k is a positive integer, said system comprising:

dividing means for dividing the original k packets into a plurality of groups of 1 packets;

an encoder for separately encoding each group of 1 packets to form a plurality of n' encoded packets for each group, where n'>1;

a transmitter for transmitting the encoded packets of all the groups in an interleaved fashion from the host computer to the at least one subscriber computer;

a receiver for receiving at least some of the transmitted packets within each group in a deinterleaved fashion;

a decoder for separately decoding each group by using any combination of 1 correctly-received packets of the group to reconstruct the 1 original packets of each group, so as to form a plurality of decoded groups; and reconstructing means for reconstructing the data from the plurality of decoded groups.

16. A storage medium storing a computer readable program executable by a host computer to perform a method for transferring data from a host computer to at least one subscriber computer, the data comprising a plurality of k original packets, where k is a positive integer, said method comprising the steps of:

encoding the k original packets to form a plurality of n encoded packets, where n>k;

transmitting the encoded packets from the host computer to the at least one subscriber computer; and decoding any combination of k correctly-received encoded packets to reconstruct the k original packets, wherein the original packets are encoded with a k×n code generator matrix and the left k×k submatrix of the k×n code generator matrix is the identity matrix, so that the first k encoded packets are the original k packets, and thus if the first k encoded packets are received correctly, the decoding step is not performed, and wherein n is recomputed for each transmission based on an estimate of the percentage of packets expected to be lost during that transmission.

17. A storage medium storing a computer readable program executable by a host computer to perform a method for transferring data from a host computer to at least one subscriber computer, the data comprising a plurality of k original packets, where k is a positive integer, said method comprising the steps of:

dividing the original k packets into a plurality of groups of 1 packets;

separately encoding each group of l packets to form a plurality of n' encoded packets for each group, where n'>1, and wherein n' is recomputed for each transmission based on an estimate of the percentage of packets expected to be lost during that transmission;

separately transmitting each group of encoded packets from the host computer to the at least one subscriber computer;

receiving, for each transmitted group, at least some of the transmitted packets;

separately decoding any combination of l correctly-received encoded packets for each group to reconstruct the l original packets of each group so as to form a plurality of decoded groups; and reconstructing the file from the plurality of decoded groups.

18. A storage medium storing a computer readable program executable by a host computer to perform a method for transferring data from a host computer to at least one subscriber computer, the data comprising a plurality of k original packets, where k is a positive integer, said method comprising the steps of:

dividing the original k packets into a plurality of groups of l packets;

separately encoding each group of l packets to form a plurality of n' encoded packets for each group, where n'>1;

transmitting the encoded packets of all the groups in an interleaved fashion from the host computer to the at least one subscriber computer;

receiving at least some of the transmitted packets within each group in a deinterleaved fashion;

separately decoding each group by using any combination of l correctly-received packets of the group to reconstruct the l original packets of each group, so as to form a plurality of decoded groups; and reconstructing the data from the plurality of decoded groups.

19. A storage medium storing a computer readable program executable by a host computer to perform a method for transferring data from a host computer to at least one subscriber computer, said method comprising the steps of:

(1) dividing the data into k original packets X, each original packet comprising j symbols from a finite field F;

(2) forming j message vectors x each of length k, the $a^{th}$ message vector being formed by taking the $a^{th}$ symbol from each of the k original packets X in sequence;

(3) matrix multiplying each of the j message vectors x by a code generator matrix G on the right to form j codeword vectors y each of length n, the code generator matrix G being a k row×n column matrix defined over the finite field F, where n>k and any k columns out of the n columns are linearly independent;

(4) forming n encoded packets Y, each encoded packet comprising j symbols, from the j codeword vectors y, the $b^{th}$ coded packet being formed by taking the $b^{th}$ symbol from each of the j codeword vectors y in sequence;

(5) transmitting the encoded packets Y from the host computer to the at least one subscriber computer;

(6) receiving Y' packets of the encoded packets Y by the at least one subscriber computer;

(7) determining which and how many of the received packets Y'_ have no error;

(8) if the number of received packets having no error is greater than or equal to k, forming a matrix A of k rows and k columns that comprises the columns from the code generator matrix G that correspond to k packets received without error;

(9) inverting the matrix A to form an inverted matrix $A^{-1}$;

(10) forming j vectors z from the k packets received without error used in step (8), the $c^{th}$ vector z being formed by taking the $c^{th}$ symbol from each of the k packets Y in sequence;

(11) matrix multiplying each of the j vectors z by the inverted matrix $A^{-1}$ on the right to form the j message vectors x of step (2);

(12) reconstructing the k original packets X from the j message vectors x of step (11), the $d^{th}$ original packet being formed by taking the $d^{th}$ symbol from each of the j message vectors x in sequence; and

(13) reconstructing the original data of step (1) from the k original packets X of step (12).

20. A system for transferring data from a host computer to at least one subscriber computer, comprising:

an encoder for (1) dividing the data into k original packets X, each original packet comprising j symbols from a finite field F, (2) forming j message vectors x each of length k, the $a^{th}$ message vector being formed by taking the $a^{th}$ symbol from each of the k original packets X in sequence, (3) matrix multiplying each of the j message vectors x by a code generator matrix G on the right to form j codeword vectors y each of length n, the code generator matrix G being a k row×n column matrix defined over the finite field F, where n>k and any k columns out of the n columns are linearly independent and (4) forming n encoded packets Y, each encoded packet comprising j symbols, from the j codeword vectors y, the $b^{th}$ coded packet being formed by taking the $b^{th}$ symbol from each of the j codeword vectors y in sequence, a transmitter for transmitting the encoded packets Y from the host computer to the at least one subscriber computer;

a receiver for receiving Y' packets of the encoded packets Y by the at least one subscriber computer; and a decoder for (1) determining which and how many of the received packets Y'_ have no error, (2) if the number of received packets having no error is greater than or equal to k, forming a matrix A of k rows and k columns that comprises the columns from the code generator matrix G that correspond to k packets received without error, (3) inverting the matrix A to form an inverted matrix $A^{-1}$, forming j vectors z from the k packets received without error, the $c^{th}$ vector z being formed by taking the $c^{th}$ symbol from each of the k packets Y in sequence, (4) matrix multiplying each of the j vectors z by the inverted matrix $A^{-1}$ on the right to form the j message vectors x, (5) reconstructing the k original packets X from the j message vectors x, the $d^{th}$ original packet being formed by taking the $d^{th}$ symbol from each of the j message vectors x in sequence, and (6) reconstructing the original data of step (1) from the k original packets X.

21. A method for transferring data from a host computer to at least one subscriber computer, said method comprising the steps of:

(1) dividing the data into k original packets X, each original packet comprising j symbols from a finite field F;

(2) forming j message vectors x each of length k, the $a^{th}$ message vector being formed by taking the $a^{th}$ symbol from each of the k original packets X in sequence;

(3) matrix multiplying each of the j message vectors x by a code generator matrix G on the right to form j codeword vectors y each of length n, the code generator matrix G being a k row×n column matrix defined over the finite field F, where n>k and any k columns out of the n columns are linearly independent;

(4) forming n encoded packets Y, each encoded packet comprising j symbols, from the j codeword vectors y, the $b^{th}$ coded packet being formed by taking the $b^{th}$ symbol from each of the j codeword vectors y in sequence;

(5) performing bit-level error detection and correction (EDAC) encoding on the symbols within the coded packets Y;

(6) transmitting the encoded packets Y from the host computer to the at least one subscriber computer;

(7) receiving Y' packets by the at least one subscriber computer;

(8) performing bit-level EDAC decoding on the symbols within the received packets Y';

(9) determining which and how many of the bit-level decoded packets Y' have no error;

(10) if the number of bit-level decoded packets having no error is greater than or equal to k, forming a matrix A of k rows and k columns that comprises the columns from the code generator matrix G that correspond to k bit-level decoded packets having no error;

(11) inverting the matrix A to form an inverted matrix $A^{-1}$;

(12) forming j vectors z from the k packets having no error used in step (10), the $c^{th}$ vector z being formed by taking the $c^{th}$ symbol from each of the k packets Y in sequence;

(13) matrix multiplying each of the j vectors z by the inverted matrix $A^{-1}$ on the right to form the j message vectors x of step (2);

(14) reconstructing the k original packets X from the j message vectors x of step (13), the $d^{th}$ original packet being formed by taking the $d^{th}$ symbol from each of the j message vectors x in sequence; and

(15) reconstructing the original data of step (1) from the k original packets X of step (14).

22. A storage medium storing a computer readable program executable by a host computer to perform a method for transferring data from a host computer to at least one subscriber computer, said method comprising the steps of:

(1) dividing the data into k original packets X, each original packet comprising j symbols from a finite field F;

(2) forming j message vectors x each of length k, the $a^{th}$ message vector being formed by taking the $a^{th}$ symbol from each of the k original packets X in sequence;

(3) matrix multiplying each of the j message vectors x by a code generator matrix G on the right to form j codeword vectors y each of length n, the code generator matrix G being a k row×n column matrix defined over the finite field F, where n>k and any k columns out of the n columns are linearly independent;

(4) forming n encoded packets Y, each encoded packet comprising j symbols, from the j codeword vectors y, the $b^{th}$ coded packet being formed by taking the $b^{th}$ symbol from each of the j codeword vectors y in sequence;

(5) performing bit-level error detection and correction (EDAC) encoding on the symbols within the coded packets Y;

(6) transmitting the encoded packets Y from the host computer to the at least one subscriber computer;

(7) receiving Y' packets by the at least one subscriber computer;

(8) performing bit-level EDAC decoding on the symbols within the received packets Y';

(9) determining which and how many of the bit-level decoded packets Y' have no error;

(10) if the number of bit-level decoded packets having no error is greater than or equal to k, forming a matrix A of k rows and k columns that comprises the columns from the code generator matrix G that correspond to k bit-level decoded packets having no error;

(11) inverting the matrix A to form an inverted matrix $A^{-1}$;

(12) forming j vectors z from the k packets having no error used in step (10), the $c^{th}$ vector z being formed by taking the $c^{th}$ symbol from each of the k packets Y in sequence;

(13) matrix multiplying each of the j vectors z by the inverted matrix $A^{-1}$ on the right to form the j message vectors x of step (2);

(14) reconstructing the k original packets X from the j message vectors x of step (13), the $d^{th}$ original packet being formed by taking the $d^{th}$ symbol from each of the j message vectors x in sequence; and

(15) reconstructing the original data of step (1) from the k original packets X of step (14).

23. A system for transferring data from a host computer to at least one subscriber computer, comprising:

a packet encoder for (1) dividing the data into k original packets X, each original packet comprising j symbols from a finite field F, (2) forming j message vectors x each of length k, the $a^{th}$ message vector being formed by taking the $a^{th}$ symbol from each of the k original packets X in sequence, (3) matrix multiplying each of the j message vectors x by a code generator matrix G on the right to form j codeword vectors y each of length n, the code generator matrix G being a k row×n column matrix defined over the finite field F, where n>k and any k columns out of the n columns are linearly independent, (4) forming n encoded packets Y, each encoded packet comprising j symbols, from the j codeword vectors y, the $b^{th}$ coded packet being formed by taking the $b^{th}$ symbol from each of the j codeword vectors y in sequence;

a bit-level encoder for performing bit-level error detection and correction (EDAC) encoding on the symbols within the coded packets Y;

a transmitter for transmitting the encoded packets Y from the host computer to the at least one subscriber computer;

a receiver for receiving Y' packets by the at least one subscriber computer;

a bit-level decoder for performing bit-level EDAC decoding on the symbols within the received packets Y'; and a packet decoder for (1) determining which and how many of the bit-level decoded packets Y' have no error, (2) if the number of bit-level decoded packets having no error is greater than or equal to k, forming a matrix A of k rows and k columns that comprises the columns from the code generator matrix G that correspond to k bit-level decoded packets having no error, (3) inverting the matrix A to form an inverted matrix $A^{-1}$, (4) forming j vectors z from the k packets having no error, the $c^{th}$ vector z being formed by taking the $c^{th}$ symbol from each of the k packets Y in sequence, (5) matrix multiplying each of the j vectors z by the inverted matrix $A^{-1}$ on the right to form the j message vectors x, (6) reconstructing the k original packets X from the j message vectors x, the $d^{th}$ original packet being formed by taking the $d^{th}$ symbol from each of the j message vectors x in sequence, and (7) reconstructing the original data of step (1) from the k original packets X.

* * * * *